(12) United States Patent
Zhu et al.

(10) Patent No.: US 9,312,361 B2
(45) Date of Patent: Apr. 12, 2016

(54) SEMICONDUCTOR DEVICES AND METHODS FOR MANUFACTURING THE SAME

(75) Inventors: Huilong Zhu, Poughkeepsie, NY (US); Qingqing Liang, Poughkeepsie, NY (US); Huicai Zhong, San Jose, CA (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 126 days.

(21) Appl. No.: 13/578,872

(22) PCT Filed: May 18, 2012

(86) PCT No.: PCT/CN2012/075713
§ 371 (c)(1),
(2), (4) Date: Oct. 10, 2013

(87) PCT Pub. No.: WO2013/170477
PCT Pub. Date: Nov. 21, 2013

(65) Prior Publication Data
US 2014/0027864 A1    Jan. 30, 2014

(30) Foreign Application Priority Data

May 15, 2012  (CN) .......................... 2012 1 0150203

(51) Int. Cl.
*H01L 29/78* (2006.01)
*H01L 29/66* (2006.01)

(52) U.S. Cl.
CPC ...... *H01L 29/6659* (2013.01); *H01L 29/66659* (2013.01); *H01L 29/7835* (2013.01)

(58) Field of Classification Search
CPC .................. H01L 21/28132; H01L 21/28141; H01L 29/66553
USPC .................................. 257/407; 438/304, 596
See application file for complete search history.

(56) References Cited

U.S. PATENT DOCUMENTS

| 6,124,174 | A  | * | 9/2000  | Gardner ............ H01L 21/28114 438/304 |
| 6,358,827 | B1 | * | 3/2002  | Chen ................. H01L 21/28114 438/304 |
| 7,045,429 | B2 | * | 5/2006  | Liu ................... H01L 29/66484 438/596 |
| 7,999,332 | B2 |   | 8/2011  | Yuan et al. .................... 257/407 |
| 8,329,566 | B2 |   | 12/2012 | Zhu et al. ...................... 438/510 |
| 2002/0001930 | A1 | | 1/2002 | Lee ................................ 438/585 |
| 2009/0294873 | A1 | | 12/2009 | Zhu et al. ..................... 257/401 |

FOREIGN PATENT DOCUMENTS

CN    101840862 A    9/2010
CN    101887916 A    11/2010

OTHER PUBLICATIONS

Search Report and Written Opinion from PCT/CN2012/075713, dated Feb. 28, 2013.
First Office Action for Chinese Patent Application No. 201210150203.X, dated Jul. 3, 2015, 10 pages.

\* cited by examiner

*Primary Examiner* — Chandra Chaudhari
(74) *Attorney, Agent, or Firm* — Westman, Champlin & Koehler, P.A.

(57) ABSTRACT

Semiconductor devices and methods for manufacturing the same are disclosed. In one embodiment, the method comprises: forming a first shielding layer on a substrate, and forming a first spacer on a sidewall of the first shielding layer; forming one of source and drain regions with the first shielding layer and the first spacer as a mask; forming a second shielding layer on the substrate, and removing the first shielding layer; forming the other of the source and drain regions with the second shielding layer and the first spacer as a mask; removing at least a portion of the first spacer; and forming a gate dielectric layer, and forming a gate conductor in the form of spacer on a sidewall of the second shielding layer or on a sidewall of a remaining portion of the first spacer.

21 Claims, 13 Drawing Sheets

SEMICONDUCTOR DEVICES AND METHODS FOR MANUFACTURING THE SAME

CROSS-REFERENCE TO RELATED APPLICATION

This Application is a Section 371 National Stage Application of International Application No. PCT/CN2012/075713, filed May 18, 2012, in Chinese, which claims priority to Chinese Application No. 201210150203.X, entitled "SEMICONDUCTOR DEVICES AND METHODS FOR MANUFACTURING THE SAME," filed on May 15, 2012, the contents of which are hereby incorporated by reference in their entirety.

TECHNICAL FIELD

The present disclosure relates to the semiconductor field, and particularly, to semiconductor devices and methods for manufacturing the same.

BACKGROUND

With continuous scaling down of semiconductor devices, short channel effects are becoming more significant. Thus, a gate stack configuration comprising a high-K gate dielectric and a metal gate conductor is proposed. To avoid degradation of the gate stack, semiconductor devices with such a gate stack configuration are manufactured generally by means of the replacement gate process. The replacement gate process involves filling the high-K dielectric and the metal gate conductor in a gap defined between gate spacers. However, it is becoming more and more difficult to fill the high-K dielectric and the metal gate conductor in the small gap due to the scaling down of the semiconductor devices.

SUMMARY

The present disclosure provides, among others, semiconductor devices and methods for manufacturing the same.

According to an aspect of the present disclosure, there is provided a method for manufacturing a semiconductor device, comprising: forming a first shielding layer on a substrate, and forming a first spacer on a sidewall of the first shielding layer; forming one of source and drain regions with the first shielding layer and the first spacer as a mask; forming a second shielding layer on the substrate, and removing the first shielding layer; forming the other of the source and drain regions with the second shielding layer and the first spacer as a mask; removing at least a portion of the first spacer; and forming a gate dielectric layer, and forming a gate conductor in the form of spacer on a sidewall of the second shielding layer or on a sidewall of a remaining portion of the first spacer.

According to a further aspect of the present disclosure, there is provided a method for manufacturing a semiconductor device, comprising: forming a first shielding layer on a substrate; forming one of source and drain regions with the first shielding layer as a mask; forming a second shielding layer on the substrate, and removing at least a portion of the first shielding layer; forming a first spacer on a sidewall of the second shielding layer or on a sidewall of a remaining portion (if any) of the first shielding layer; forming the other of the source and drain regions with the second shielding layer, the remaining portion (if any) of the first shielding layer and the first spacer as a mask; removing the first spacer; and forming a gate dielectric layer, and forming a gate conductor in the form of spacer on a sidewall of the second shielding layer or on a sidewall of the remaining portion of the first shielding layer.

According to a still further aspect of the present disclosure, there is provided a semiconductor device, comprising: a substrate; and source and drain regions and a gate stack formed on the substrate. The gate stack may comprise: a gate dielectric layer; and a gate conductor, which is formed in the form of spacer on a sidewall of a dielectric layer or a gate spacer on one side of the gate stack.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
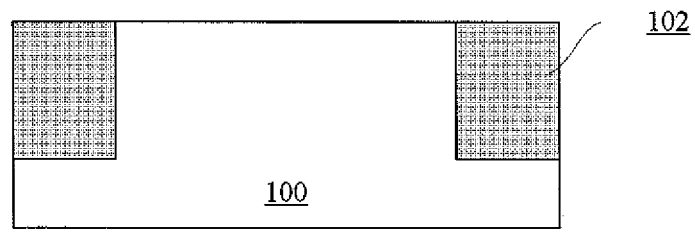
FIGS. 1-9 are schematic views showing a flow of manufacturing a semiconductor device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art can also devise regions/layers of other different shapes, sizes, and relative positions as desired.

In the context of the present disclosure, when a layer/element is recited as being "on" a further layer/element, the layer/element can be disposed directly on the further layer/element, or otherwise there may be an intervening layer/element interposed therebetween. Further, if a layeaelernent is "on" a further layer/element in an orientation, then the layer/element can be "under" the further layer/element when the orientation is turned.

In the conventional process, after source and drain regions are formed in a substrate with the aid of a "dummy" gate stack and spacers on opposite sides of the dummy gate stack, the spacers are reserved to define a gap therebetween, and a true gate stack can be formed by filling the gap. In contrast, the present disclosure proposes a "replacement spacer" process. Specifically, after source and drain regions are formed, material layer(s) present on the side of either one of the source and drain regions is (are) reserved, and a gate stack (particularly, a gate conductor) is formed in the form of spacer on a sidewall of the reserved material layer(s). In this way, formation of the gate stack is done in a relatively large space (substantially corresponding to a gate region+the other of the source and drain regions). This process is easier to perform as compared with the conventional process where formation of the gate stack is done in the small gap between the spacers.

The technology of the present disclosure can be implemented in various ways, some of which will be described in the following by way of example.

Firstly, a flow of manufacturing a semiconductor device according to an embodiment of the present disclosure is described with reference to FIGS. 1-9.

As shown in FIG. 1, a substrate 100 is provided. The substrate 100 may comprise any suitable substrate, including, but not limited to, a bulk semiconductor substrate such as a bulk Si substrate, a Semiconductor On Insulator (SOI) substrate, a SiGe substrate, and the like. In the following, the substrate is described as a bulk Si substrate for convenience. On the substrate 100, Shallow Trench Isolations (STIs) 102 can be formed to isolate active regions of individual devices. For example, the STIs 102 may comprise oxide (e.g., silicon oxide). In the following, formation of a single one device is described for convenience. However, it is to be noted that the present disclosure is not limited thereto, and is also applicable to formation of two or more devices.

Figure 2:
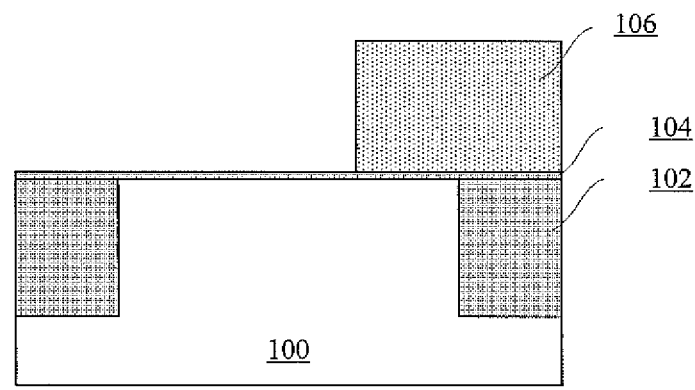

Next, as shown in FIG. 2, a thin oxide layer (e.g., silicon oxide) 104 is optionally formed on a surface of the substrate 100 by means of e.g. deposition. For example, the oxide layer 104 may have a thickness of about 5-10 nm, and can be used to form an Interfacial Layer (IL) subsequently. On the substrate 100 (or on the oxide layer 104 in the case where the oxide layer 104 is formed), a first shielding layer 106 with a thickness of e.g. about 100-200 nm can be formed by means of e.g. deposition. For example, the first shielding layer 106 may comprise nitride (e.g. silicon nitride). The first shielding layer 106 can be patterned by means of e.g. Reactive Ion Etching (RIE) to cover a portion of the active region (which portion substantially corresponds to a later formed source or drain region).

Figure 3:
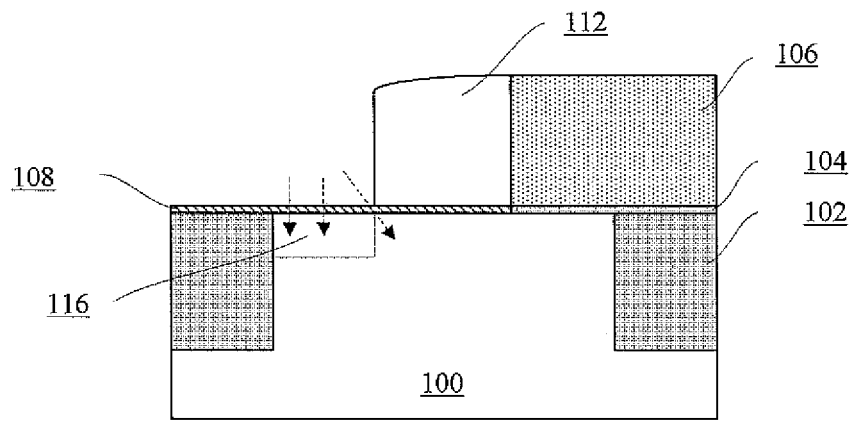

In the case where the oxide layer 104 is formed, the oxide layer 104 can be selectively etched with respect to the first shielding layer 106 (e.g., nitride) and the substrate 100 (e.g., bulk Si), to form an IL 108 with a thickness of e.g. about 0.5-1 nm, as shown in FIG. 3. Here, the difference in thickness between the IL 108 and the oxide layer 104 is not shown for convenience of illustration.

Further, as shown in FIG. 3, a first spacer 112 may be formed on a sidewall of the first shielding layer 106. For example, the first spacer 112 is formed to have a width of about 15-60 nm to cover a portion of the active region (which portion substantially corresponds to a later formed gate region). The first spacer 112 may comprise polysilicon or amorphous silicon, for example. There are various ways to form the spacer, and detailed descriptions on formation of the spacer are omitted here.

Thus, the first shielding layer 106 and the first spacer 112 expose a portion of the active region. Then, one of the source and drain regions can be formed in the exposed portion of the active region by means of a source/drain formation process. For example, this can be done as follows.

Specifically, as shown in FIG. 3 (especially, indicated by vertical arrows shown therein), extension implantation can be carried out to form an extension region 116. For example, for a p-type device, the implantation can be done by implanting p-type impurities such as In, $BF_2$ or B; for a n-type device, the implantation can be done by implanting n-type impurities such as As or P, to form the extension region. It is to be noted that the dashed line block 116 in FIG. 3 is shown as a regular rectangular shape for convenience of illustration. In practice, the profile of the extension region 116 depends on the process, and may have no definite boundaries. Further, to improve the performance, halo implantation can be carried out before the extension implantation, as indicated by angled arrows in FIG. 3. For example, for a p-type device, the implantation can be done by implanting n-type impurities such as As or P; for a n-type device, the implantation can be done by implanting p-type impurities such as In, $BF_2$ or B, to form a halo region (not shown).

Figure 4:
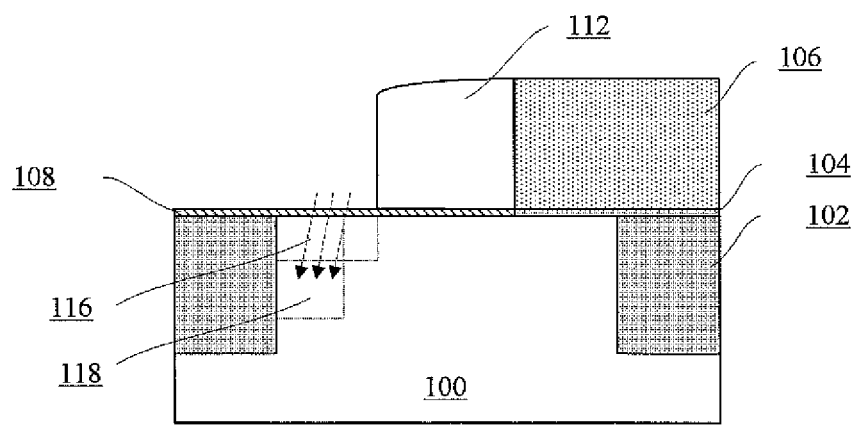

Then, as indicated by arrows in FIG. 4, source/drain implantation can be done to form a source/drain implantation region 118. For example, for a p-type device, the implantation can be done by implanting p-type impurities such as in, $BF_2$ or B; for a n-type device, the implantation can be done by implanting n-type impurities such as As or P, to form the source/drain implantation region. It is to be noted that the dashed line block 118 in FIG. 4 is shown as a regular rectangular shape for convenience of illustration. In practice, the profile of the source/drain implantation region 118 depends on the process, and may have no definite boundaries.

Figure 5:
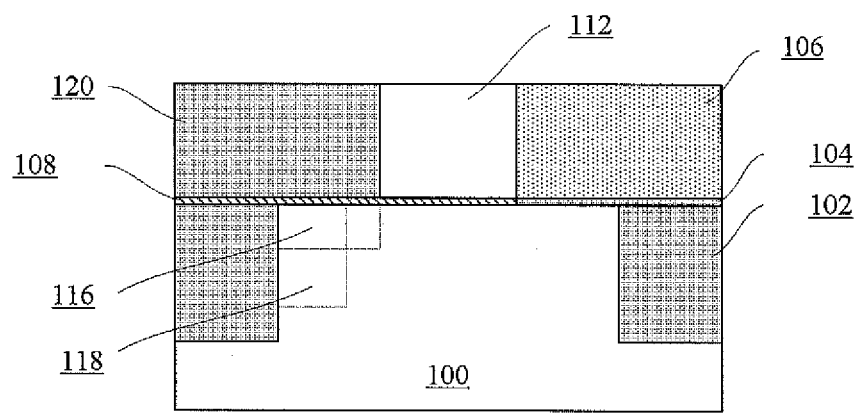

Next, as shown in FIG. 5, a second shielding layer 120 may be formed on the substrate 100, to cover at least the above formed one of the source and drain regions. For example, the second shielding layer 120 may comprise oxide (e.g., silicon oxide). Then, a planarization process such as Chemical Mechanical Polishing (CMP) can be performed to expose the first shielding layer 106 and the first spacer 112 to facilitate following processes.

Figure 6:
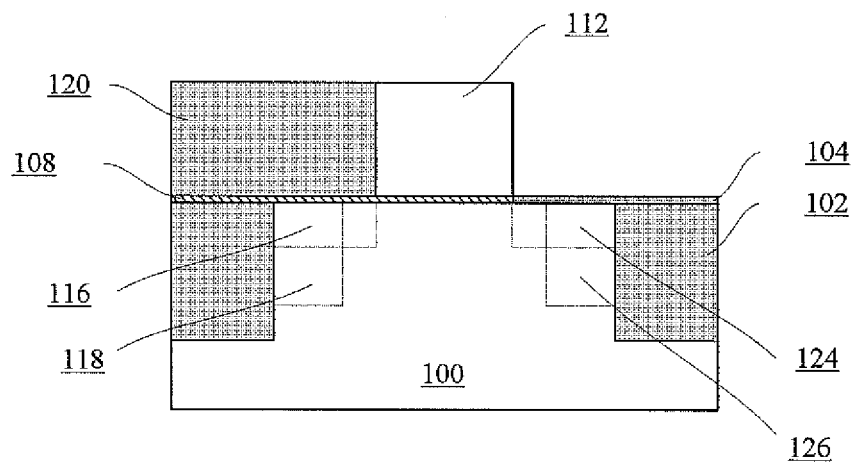

Subsequently, as shown in FIG. 6, the first shielding layer 106 can be removed by selectively etching the first shielding layer 106 (e.g., silicon nitride) with respect to the first spacer 112 (e.g., polysilicon or amorphous silicon), and the second shielding layer 120 and the oxide layer 104 (e.g., silicon oxide). The selective etching can be done by hot phosphoric acid, for example.

Thus, as shown in FIG. 6, the second shielding layer 120 and the first spacer 112 expose a portion of the active region. Then, the other of the source and drain regions can be formed in the exposed portion of the active region by means of a source/drain formation process. For example, this can be done as follows.

Specifically, as shown in FIG. 6, extension implantation can be carried out to form an extension region 124. For example, for a p-type device, the implantation can be done by implanting p-type impurities such as In, $BF_2$ or B; for a n-type device, the implantation can be done by implanting n-type impurities such as As or P, to form the extension region. It is to be noted that the dashed line block 124 in FIG. 6 is shown as a regular rectangular shape for convenience of illustration. In practice, the profile of the extension region 124 depends on the process, and may have no definite boundaries. Further, to improve the performance, halo implantation can be carried out before the extension implantation. For example, for a p-type device, the implantation can be done by implanting n-type impurities such as As or P; for a n-type device, the implantation can be done by implanting p-type impurities such as In, $BF_2$ or B, to form a halo region (not shown). After that, source/drain implantation can be done to form a source/drain implantation region 126. For example, for a p-type device, the implantation can be done by implanting p-type impurities such as In, $BF_2$ or B; for a n-type device, the implantation can be done by implanting n-type impurities such as As or P, to form the source/drain implantation region. It is to be noted that the dashed line block 126 in FIG. 6 is shown as a regular rectangular shape for convenience of illustration. In practice, the profile of the source/drain implantation region 126 depends on the process, and may have no definite boundaries.

Figure 7:
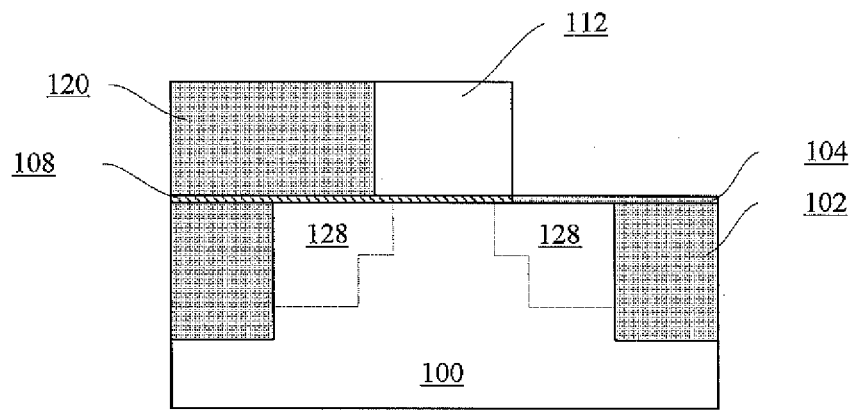

Next, as shown in FIG. 7, annealing, such as spike annealing, laser annealing, and flash annealing, can be performed to activate the implanted impurities, to form final source and drain regions 128. Then, the first spacer 112 can be removed by selective etching. For example, the first spacer 112 (e.g., polysilicon or amorphous silicon) may be selectively removed by means of a TMAH solution. As a result, a relatively large space (substantially corresponding to the gate region+the other of the source and drain regions) is reserved on the side of the second shielding layer 120, so that it is easy to form a gate stack.

Figure 8:
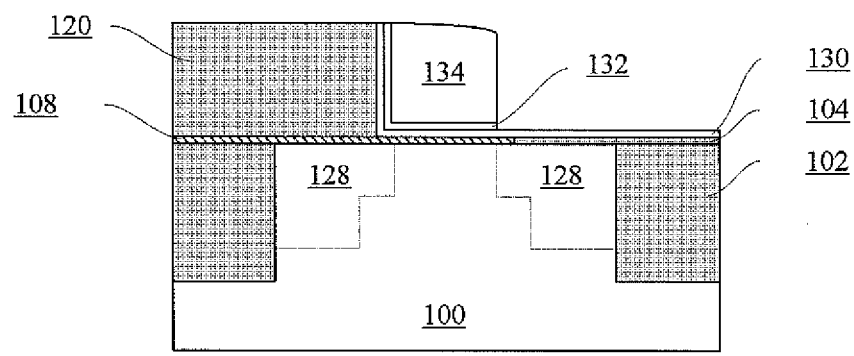

Then, as shown in FIG. 8, the gate stack can be formed. Specifically, a gate dielectric layer 130 can be formed by means of e.g. deposition. For example, the gate dielectric layer 130 may comprise a high-K gate dielectric material such as $HfO_2$, with a thickness of about 2-4 nm. Optionally, an IL can be rebuilt before formation of the gate dielectric layer 130. For example, the IL (not shown) can be formed by selectively etching the oxide layer 104, as described above with reference to FIG. 3. On the gate dielectric layer 130, a gate conductor 134 can be formed in the form of spacer. In formation of the gate conductor, parameters adopted in the spacer formation process, such as deposition thickness and RIE parameters, can be controlled to locate the gate conductor 134 in the form of spacer substantially between the underlying source and drain regions formed as described above. For example, the gate conductor 134 may comprise a metal gate conductor material, such as Ti, Co, Ni, Al, W, or any alloy thereof. Preferably, there may be a work function adjustment layer 132 sandwiched between the gate dielectric layer 130 and the gate conductor 134. For example, the work function adjustment layer 132 may comprise any one of TaC, TiN, TaTbN, TaErN, TaYbN, TaSiN, HfSiN, MoSiN, RuTa, NiTa, MoN, TiSiN, TiCN, TaAlC, TiAlN, TaN, PtSi, $Ni_3Si$, Pt, Ru, Ir, Mo, HfRu, $RuO_x$, or any combination thereof, with a thickness of about 2-10 nm.

Figure 9:
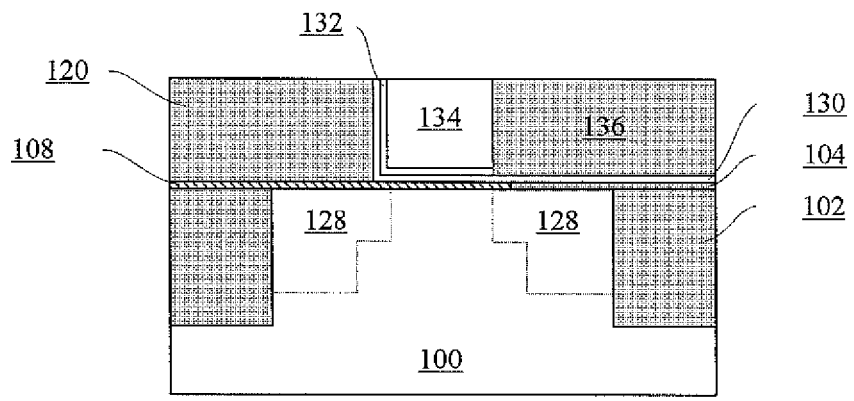

After that, as shown in FIG. 9, a dielectric layer 136 can be formed by means of e.g. deposition, and planarized by means of e.g., CMP. The dielectric layer 136 may comprise oxide (e.g., silicon oxide), nitride or any combination thereof. Then, peripheral components such as contacts can be formed, and detailed descriptions thereof are omitted here.

Thus, an illustrative semiconductor device according to the present disclosure is achieved. As shown in FIG. 9, the semiconductor device may comprise the source and drain regions (128) and the gate stack (130, 132, 134) formed on the substrate. The gate stack, especially, the gate conductor 134, is formed in the form of spacer on the sidewall of the shielding layer (or, a dielectric layer) 120 on one side (the left side in the example shown in FIG. 9) of the gate stack.

Figure 10:
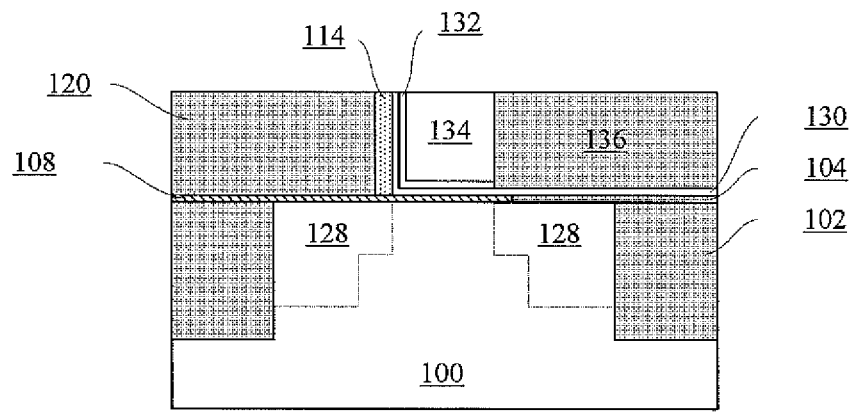
FIG. 10 is a schematic view showing a semiconductor device according to a further embodiment of the present disclosure.

FIG. 10 is a schematic view showing a semiconductor device according to a further embodiment of the present disclosure. The semiconductor device shown in FIG. 10 differs from that shown in FIG. 9 in that: the gate stack, especially, the gate conductor 134, is formed in the form of spacer on a sidewall of a second spacer 114 on one side (the left side in the example shown in FIG. 10) of the gate stack.

The device shown in FIG. 10 can be manufactured according to the process described above with reference to FIGS. 1-9. For example, the second spacer 114 can be additionally formed on the sidewall of the second shielding layer 120 after the first spacer 112 is removed (referring to the above descriptions in conjunction with FIG. 7). The second spacer 114 may comprise nitride (e.g., silicon nitride), with a thickness of about 5-20 nm. Alternatively, the second spacer 114 may be formed by the first spacer 112 which is partially removed in the process of removing the first spacer 112 (referring to the above descriptions in conjunction with FIG. 7), or may be formed on a sidewall of the first spacer 112 (referring to FIG. 4) in which case the second shielding layer 120 is formed on a sidewall of the second spacer 114 (referring to FIG. 5).

Next, a flow of manufacturing a semiconductor device according to a further embodiment of the present disclosure is described with reference to FIGS. 11-17. Similar or like reference symbols in FIGS. 11-17 denote similar or like components as those shown in FIGS. 1-9. In the following, descriptions are mainly directed to differences between this embodiment and the above described embodiments.

Figure 11:
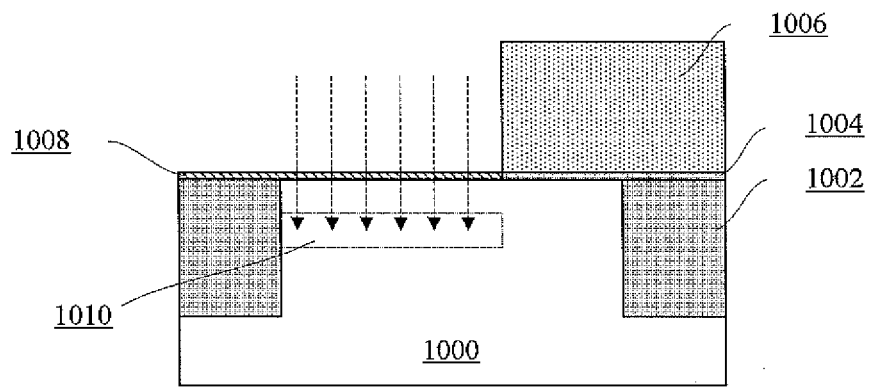
FIGS. 11-17 are schematic views showing a flow of manufacturing a semiconductor device according to a further embodiment of the present disclosure.

As shown in FIG. 11, a substrate 1000 is provided. On the substrate 1000, STIs 1002 can be formed. Optionally, a thin oxide layer 1004 is formed on a surface of the substrate 1000. For details of the substrate 1000 and the oxide layer 1004, reference may be made to the above descriptions on the substrate 100 and the oxide layer 104 in conjunction with FIGS. 1-2.

On the substrate 1000 (or on the oxide layer 1004 in the case where the oxide layer 1004 is formed), a first shielding layer 1006 with a thickness of e.g. about 100-200 nm can be formed by means of e.g. deposition. For example, the first shielding layer 1006 may comprise nitride (e.g. silicon nitride). The first shielding layer 1006 can be patterned by means of e.g. RIE to cover a portion of the active region (which portion substantially corresponds to a later formed source or drain region).

According to an embodiment, for better control of short channel effects and suppression of band-to-band leakage, a Super-Steep-Retrograded Well (SSRW) 1010 can be formed by ion implantation (indicated by arrows), as shown in FIG. 11. For example, for a p-type device, the implantation can be done by implanting n-type impurities such as As, P, or Sb; for a n-type device, the implantation can be done by implanting p-type impurities such as In, $BF_2$ or B, to form the SSRW. It is to be noted that the dashed line block 1010 in FIG. 11 is shown as a regular rectangular shape for convenience of illustration. In practice, the profile of the SSRW 1010 depends on the process, and may have no definite boundaries.

Figure 12:
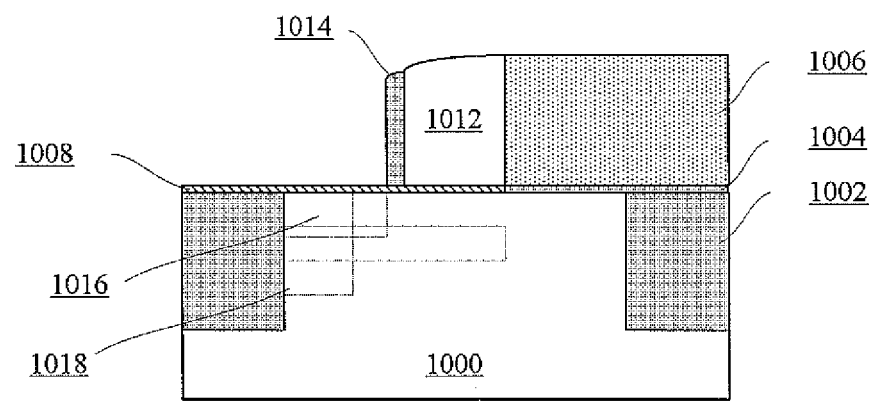

Subsequently, as shown in FIG. 12, a first sub-spacer 1012 may be formed on a sidewall of the first shielding layer 1006. For example, the first sub-spacer 1012 is formed to have a width of about 5-50 nm to cover a portion of the active region (which portion substantially corresponds to a later formed gate region). The first sub-spacer 1012 may comprise polysilicon or amorphous silicon, for example. On a sidewall of the first sub-spacer 1012, a second sub-spacer 1014 may be formed. For example, the second sub-spacer 1014 may comprise oxide (e.g., silicon oxide), with a dimension substantially corresponding to a gate spacer (e.g., with a width of about 5-20 nm). There are various ways to form the spacers, and detailed descriptions on formation of the spacers are omitted here.

Thus, the first shielding layer 1006 and a first spacer (including the first sub-spacer 1012 and the second sub-spacer 1014) expose a portion of the active region. Then, one of the source and drain regions can be formed in the exposed portion of the active region by means of a source/drain formation process. For example, a halo region (not shown), an extension region 1016 and a source/drain implantation region 1018 can be formed according to the process described above in conjunction with FIGS. 3 and 4. For details of the halo region, the extension region 1016 and the source/drain implantation region 1018, reference may be made to the above descriptions in conjunction with FIGS. 3 and 4.

Figure 13:
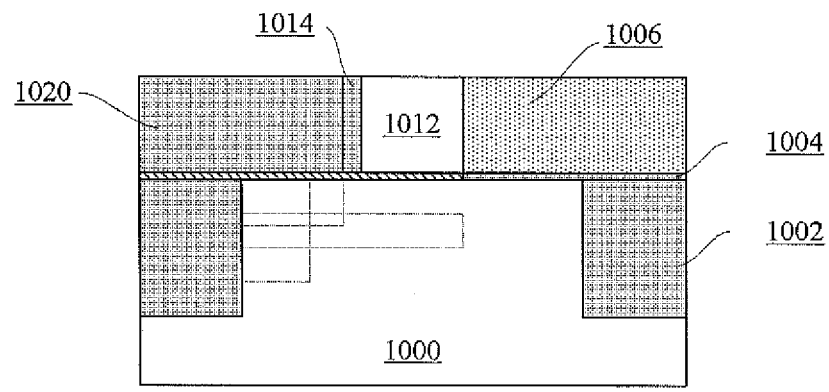

Next, as shown in FIG. 13, a second shielding layer 1020 may be formed on the substrate, to cover at least the above formed one of the source and drain regions. For example, the second shielding layer 120 may comprise oxide (e.g., silicon oxide). Then, a planarization process such as Chemical Mechanical Polishing (CMP) can be performed to expose the first shielding layer 1006 and the first spacer (including the first sub-spacer 1012 and the second sub-spacer 1014) to facilitate following processes (as described above in conjunction with FIG. 5).

Figure 14:
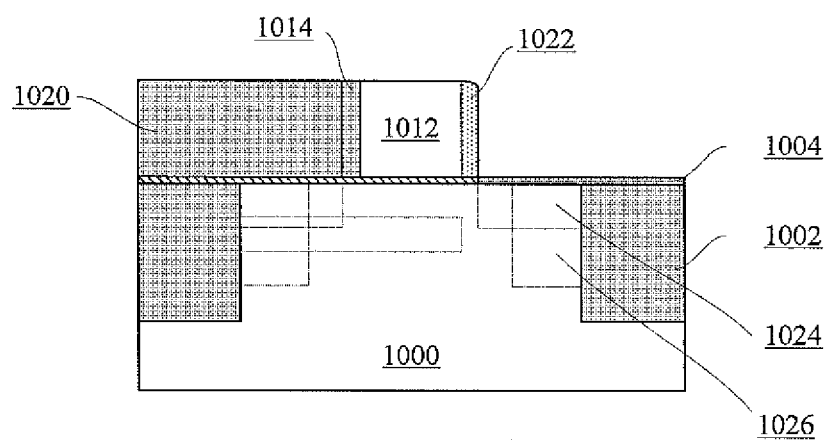

Subsequently, as shown in FIG. 14, the first shielding layer 1006 can be removed by selectively etching (as described above in conjunction with FIG. 6). Then, a second spacer 1022 can be formed on a sidewall of the first sub-spacer 1012. For example, the second spacer 1022 may comprise nitride (e.g., silicon nitride), with a dimension substantially corresponding to a gate spacer (e.g., with a width of about 5-20 nm).

Thus, as shown in FIG. 14, the second shielding layer 120, the first spacer (including the first sub-spacer 1012 and the second sub-spacer 1014), and the second spacer 1022 expose a portion of the active region. Then, the other of the source and drain regions can be formed in the exposed portion of the active region by means of a source/drain formation process. For example, a halo region (not shown), an extension region 1024 and a source/drain implantation region 1026 can be formed according to the process described above in conjunction with FIG. 6. For details of the halo region, the extension region 1024 and the source/drain implantation region 1026, reference may be made to the above descriptions in conjunction with FIG. 6.

Figure 15:
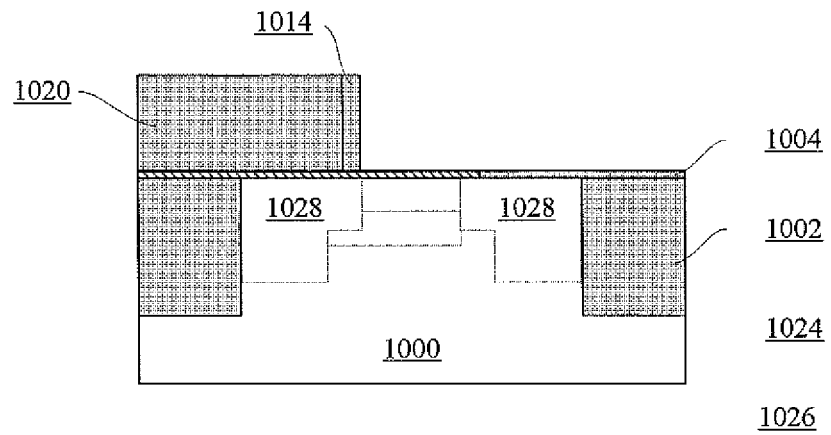

Next, as shown in FIG. 15, annealing, such as spike annealing, laser annealing, and flash annealing, can be performed to activate the implanted impurities, to form final source and drain regions 1028.

Subsequently, the second spacer 1022 and a portion of the first spacer (specifically, the first sub-spacer 1012) can be removed by selective etching to leave the second sub-spacer 1014 remained. For example, the second spacer 1022 (e.g., silicon nitride) may be selectively removed by hot phosphoric acid, and the first sub-spacer 1012 (e.g., polysilicon or amorphous silicon) may be selectively removed by means of a TMAH solution. As a result, a relatively large space (substantially corresponding to the gate region+the other of the source and drain regions) is reserved on the side of the second sub-spacer 1014, so that it is easy to form a gate stack.

Figure 16:
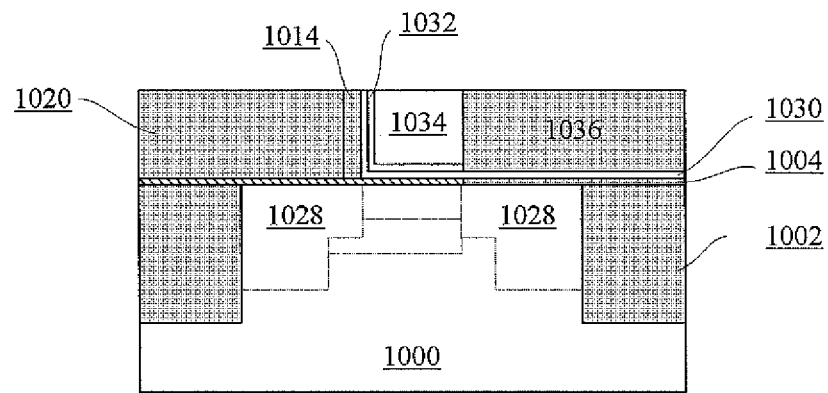

Then, as shown in FIG. 16, the gate stack can be formed. Specifically, a gate dielectric layer 1030, a work function adjustment layer 1032, and a gate conductor 1034 in the form of spacer can be formed sequentially (as described above in conjunction with FIG. 8). After that, a dielectric layer 1036 can be formed by means of e.g. deposition, and planarized by means of e.g., CMP. The dielectric layer 1036 may comprise oxide (e.g., silicon oxide), nitride or any combination thereof (as described above in conjunction with FIG. 9).

Figure 17:
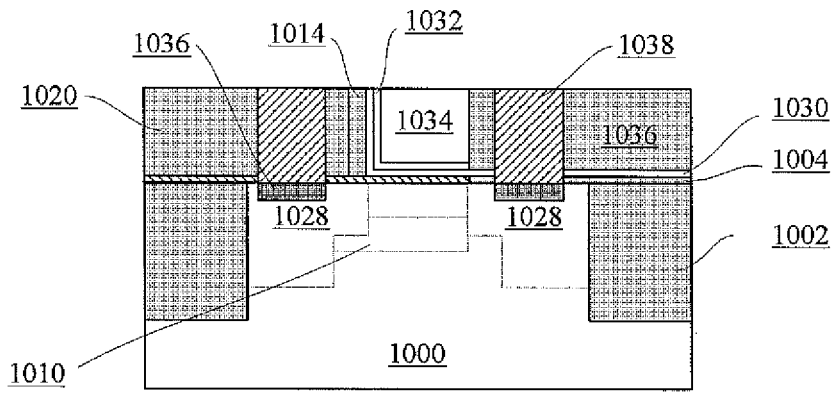

Next, as shown in FIG. 17, contacts 1038 corresponding to the source and drain regions can be formed. For example, the contacts 1038 may comprise metal such as W or Cu. According to an embodiment, to improve the ohmic contact, a metal silicide layer 1036 may be formed in the source and drain regions, so that the contacts 1038 are in electrical contact with the source and drain regions via the metal silicide layer 1036. For example, the metal silicide layer 1036 may comprise NiPtSi. There are various ways to form the metal silicide layer 1036 and the contacts 1038, and detailed descriptions thereof are omitted here.

Thus, an illustrative semiconductor device according to the present disclosure is achieved. As shown in FIG. 17, the semiconductor device may comprise the source and drain regions (1028) and the gate stack (1030, 1032, 1034) formed on the substrate. On one side (the left side in the example shown in FIG. 17) of the gate stack, there is the gate spacer 1014. The gate stack, especially, the gate conductor 134, is formed in the form of spacer on the sidewall of the second sub-spacer (or the gate spacer) 1014. The semiconductor device may comprise the asymmetric SSRW 1010, which extends in the substrate under the gate stack and extends to the source or drain region on the one side of the gate stack.

Next, a flow of manufacturing a semiconductor device according to a further embodiment of the present disclosure is described with reference to FIGS. 18-20. Similar or like reference symbols in FIGS. 18-20 denote similar or like components as those shown in FIGS. 1-10. In the following, descriptions are mainly directed to differences between this embodiment and the above described embodiments.

Figure 18:
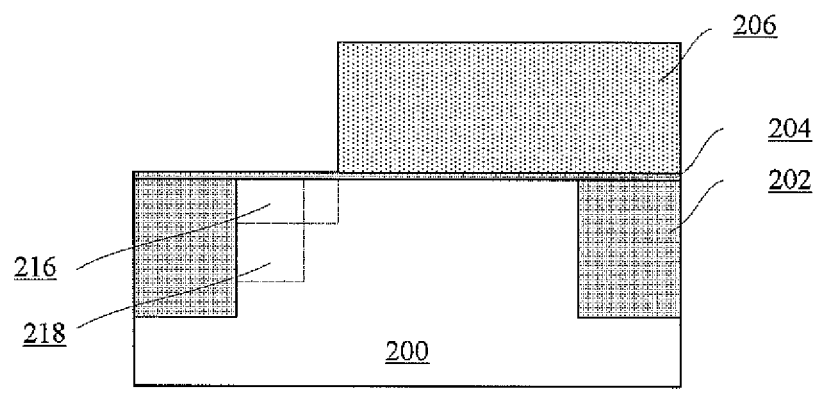
FIGS. 18-20 are schematic views showing a flow of manufacturing a semiconductor device according to a further embodiment of the present disclosure.

As shown in FIG. 18, a substrate 200 is provided. On the substrate 200, STIs 202 can be formed. Optionally, a thin oxide layer 204 is formed on a surface of the substrate 200. For details of the substrate 200 and the oxide layer 204, reference may be made to the above descriptions on the substrate 100 and the oxide layer 104 in conjunction with FIGS. 1-2.

On the substrate 200 (or on the oxide layer 204 in the case where the oxide layer 204 is formed), a first shielding layer 206 with a thickness of e.g. about 100-200 nm can be formed by means of e.g. deposition. For example, the shielding layer 206 may comprise nitride (e.g. silicon nitride). The shielding layer 206 can be patterned by means of e.g. RIE to expose a portion of the active region (which portion substantially corresponds to a later formed source or drain region). Then, one of the source and drain regions can be formed in the exposed portion of the active region by means of a source/drain formation process. For example, a halo region (not shown), an extension region 216 and a source/drain implantation region 218 can be formed according to the process described above in conjunction with FIGS. 3 and 4. For details of the halo region, the extension region 216 and the source/drain implantation region 218, reference may be made to the above descriptions in conjunction with FIGS. 3 and 4.

Figure 19:
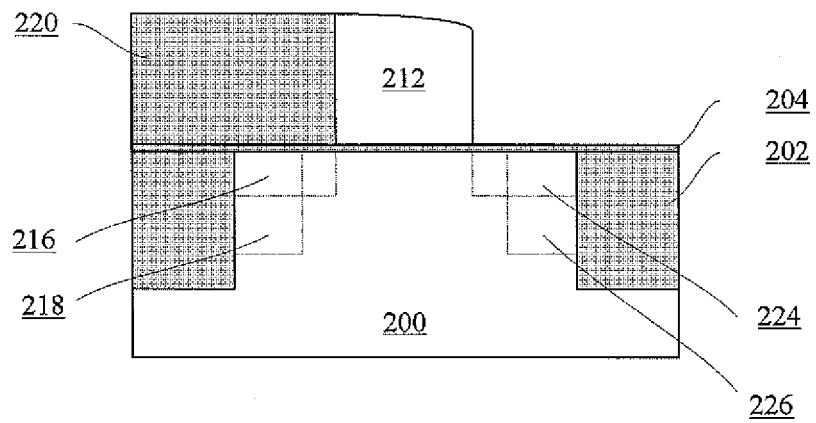

Next, as shown in FIG. 19, a second shielding layer 220 may be formed on the substrate, to cover at least the above formed one of the source and drain regions. For example, the second shielding layer 220 may comprise oxide (e.g., silicon oxide). Then, a planarization process such as CMP can be performed to expose the first shielding layer 206, which then can be removed by selective etching. Then, a first spacer 212 may be formed on a sidewall of the second shielding layer 220. For example, the first spacer 212 may be formed to have a width of about 15-60 nm, to cover a portion of the active region (which portion substantially corresponds to a later formed gate region). The first spacer 212 may comprise polysilicon or amorphous silicon, for example.

Thus, the second shielding layer 220 and the first spacer 212 expose a portion of the active region. Then, the other of the source and drain regions can be formed in the exposed portion of the active region by means of a source/drain formation process. For example, a halo region (not shown), an extension region 224 and a source/drain implantation region 226 can be formed according to the process described above in conjunction with FIG. 6. For details of the halo region, the extension region 224 and the source/drain implantation region 226, reference may be made to the above descriptions in conjunction with FIG. 6.

Figure 20:
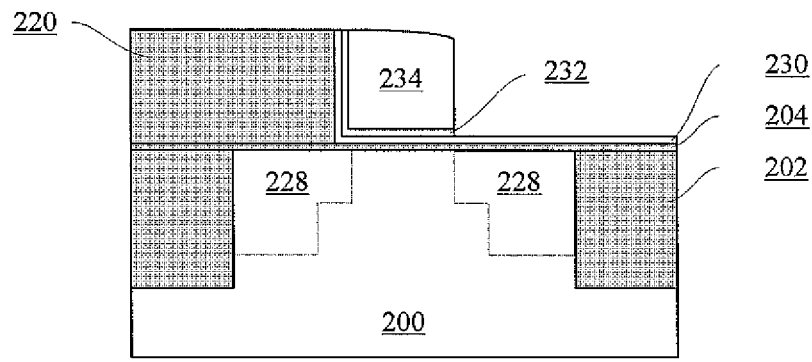

Next, as shown in FIG. 20, annealing, such as spike annealing, laser annealing, and flash annealing, can be performed to activate the implanted impurities, to form final source and drain regions 228.

Subsequently, the first spacer 212 can be removed by selective etching. For example, the first spacer 212 (e.g., polysilicon or amorphous silicon) may be selectively removed by means of a TMAH solution. As a result, a relatively large space (substantially corresponding to the gate region+the other of the source and drain regions) is reserved on the side of the second shielding layer 220, so that it is easy to form a gate stack. For example, a gate dielectric layer 230, a work function adjustment layer 232, and a gate conductor 234 in the form of spacer can be formed sequentially (as described above in conjunction with FIG. 8). The device shown in FIG. 20 is substantially same in structure as the device shown in FIG. 8. After that, a dielectric layer (referring to 236 shown in FIG. 21) can be deposited and planarized, and peripheral components such as contacts can be formed. Detailed descriptions thereof are omitted here.

Though the above descriptions in conjunction with the embodiment shown in FIGS. 18-20 do not involve an IL, operations for forming the IL can be done as described in the above embodiments.

Figure 21:
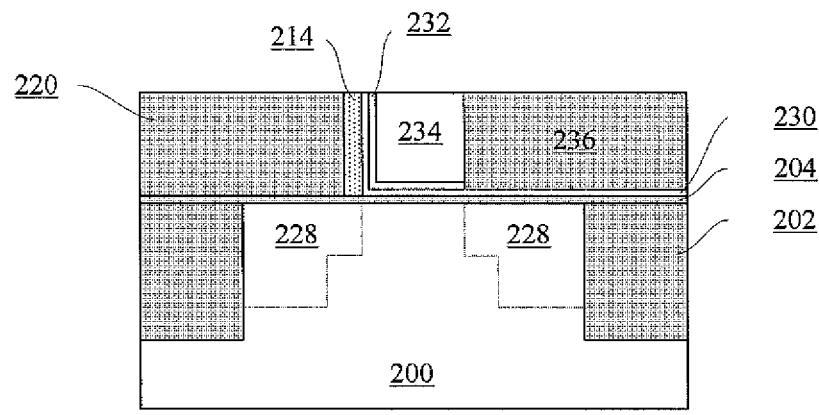
FIG. 21 is a schematic view showing a semiconductor device according to a further embodiment of the present disclosure.

FIG. 21 is a schematic view showing a semiconductor device according to a further embodiment of the present disclosure. The semiconductor device shown in FIG. 21 differs from that shown in FIG. 20 in that: the gate stack, especially, the gate conductor 234, is formed in the form of spacer on a sidewall of a second spacer 214 on one side (the left side in the example shown in FIG. 21) of the gate stack.

The device shown in FIG. 21 can be manufactured according to the process described above with reference to FIGS. 18-20. For example, the second spacer 214 can be additionally formed on the sidewall of the second shielding layer 220 after the first spacer 212 is removed (referring to the above descriptions in conjunction with FIG. 20). The second spacer 214 may comprise nitride (e.g., silicon nitride), with a thickness of about 5-20 nm. Alternatively, the second spacer 214 may be formed by the first shielding layer 206 which is partially removed in the process of removing the first shielding layer 206 (referring to the above descriptions in conjunction with FIG. 19), or may be formed on a sidewall of the second shielding layer 220 in which case the first spacer 212 is formed on a sidewall of the second spacer 214 (referring to FIG. 19).

Next, a flow of manufacturing a semiconductor device according to a further embodiment of the present disclosure is described with reference to FIGS. 22-26. Similar or like reference symbols in FIGS. 22-26 denote similar or like components as those shown in FIGS. 1-10. In the following, descriptions are mainly directed to differences between this embodiment and the above described embodiments.

Figure 22:
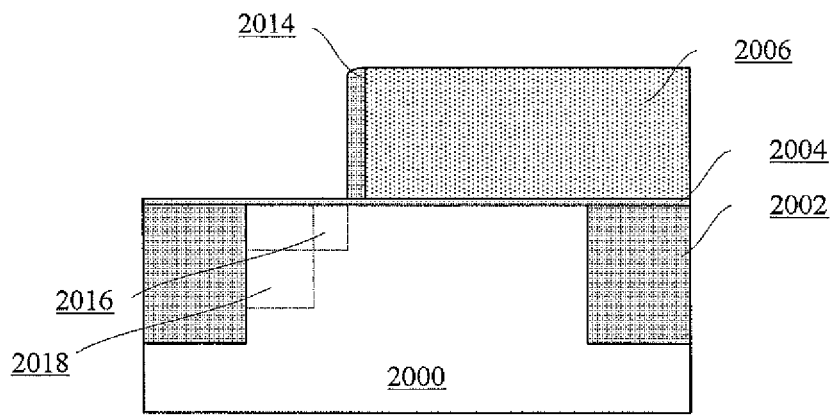
FIGS. 22-26 are schematic views showing, in part, a flow of manufacturing a semiconductor device according to a further embodiment of the present disclosure.

As shown in FIG. 22, a substrate 2000 is provided. On the substrate 2000, STIs 2002 can be formed. Optionally, a thin oxide layer 2004 is formed on a surface of the substrate 2000. For details of the substrate 2000 and the oxide layer 2004, reference may be made to the above descriptions on the substrate 100 and the oxide layer 104 in conjunction with FIGS. 1-2.

On the substrate 2000 (or on the oxide layer 2004 in the case where the oxide layer 2004 is formed), a first shielding sub-layer 2006 with a thickness of e.g. about 100-200 nm can be formed by means of e.g. deposition. For example, the first shielding sub-layer 2006 may comprise nitride (e.g. silicon nitride). On a sidewall of the first shielding sub-layer 2006, a first sub-spacer 2014 can be formed. For example, the first sub-spacer 2014 may comprise oxide (e.g., silicon oxide), with a dimension substantially corresponding to a gate spacer (e.g., with a width of about 5-20 nm). Thus, the first shielding sub-layer 2006 and a first sub-spacer 2014 expose a portion of the active region (which portion substantially corresponds to a later formed source or drain region). Then, one of the source and drain regions can be formed in the exposed portion of the active region by means of a source/drain formation process. For example, a halo region (not shown), an extension region 2016 and a source/drain implantation region 2018 can be formed according to the process described above in conjunction with FIGS. 3 and 4. For details of the halo region, the extension region 2016 and the source/drain implantation region 2018, reference may be made to the above descriptions in conjunction with FIGS. 3 and 4.

Figure 23:
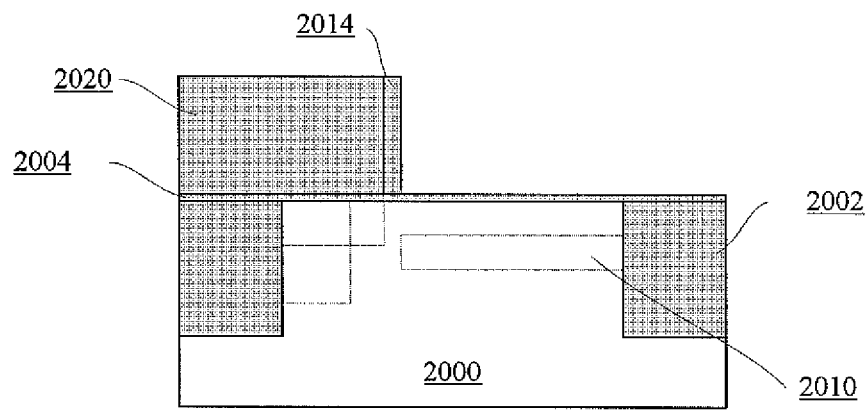

Next, as shown in FIG. 23, a second shielding layer 2020 may be formed on the substrate, to cover at least the above formed one of the source and drain regions. For example, the second shielding layer 120 may comprise oxide (e.g., silicon oxide). Then, a planarization process such as CMP can be performed to expose the first shielding sub-layer 2006 and the first sub-spacer 2014. The first shielding sub-layer 2006 can be removed by selective etching.

According to an embodiment, for better control of short channel effects and suppression of band-to-band leakage, a SSRW 2010 can be formed by ion implantation, as shown in FIG. 23. For details of the SSRW 2010, reference may be made to the above descriptions in conjunction with FIG. 11.

Figure 24:
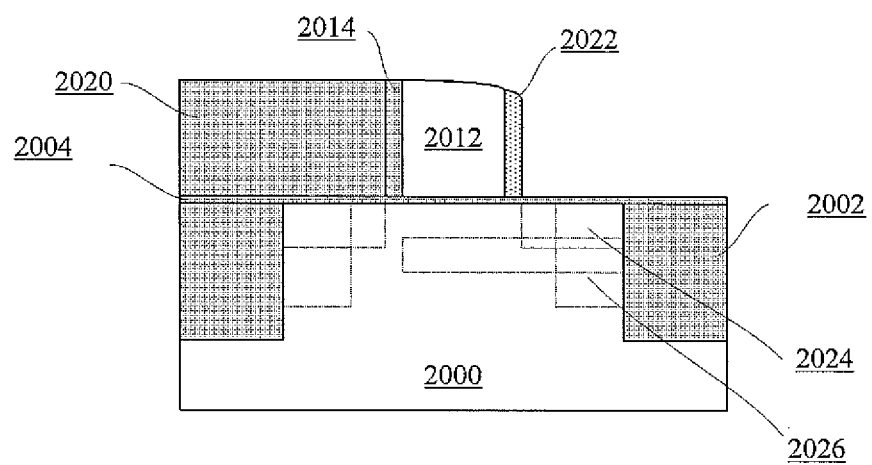

Subsequently, as shown in FIG. 24, a second sub-spacer 2012 may be formed on a sidewall of the first sub-spacer 2014. For example, the second sub-spacer 2012 is formed to have a width of about 5-50 nm to cover a portion of the active region (which portion substantially corresponds to a later formed gate region). The second sub-spacer 1012 may comprise polysilicon or amorphous silicon, for example. On a sidewall of the second sub-spacer 2012, a third sub-spacer 2022 may be formed. For example, the third sub-spacer 2022 may comprise nitride (e.g., silicon nitride), with a dimension substantially corresponding to a gate spacer (e.g., with a width of about 5-20 nm). Thus, the second shielding layer 2020, the first sub-spacer 2014, the second sub-spacer 2012, and the third sub-spacer 2022 expose a portion of the active region. Then, the other of the source and drain regions can be formed in the exposed portion of the active region by means of a source/drain formation process. For example, a halo region (not shown), an extension region 2024 and a source/drain implantation region 2026 can be formed according to the process described above in conjunction with FIG. 6. For details of the halo region, the extension region 2024 and the source/drain implantation region 2026, reference may be made to the above descriptions in conjunction with FIG. 6.

Figure 25:
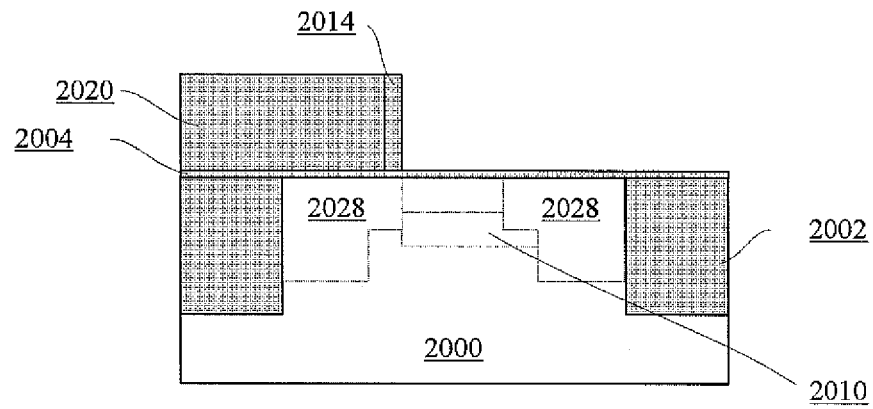
Figure 26:
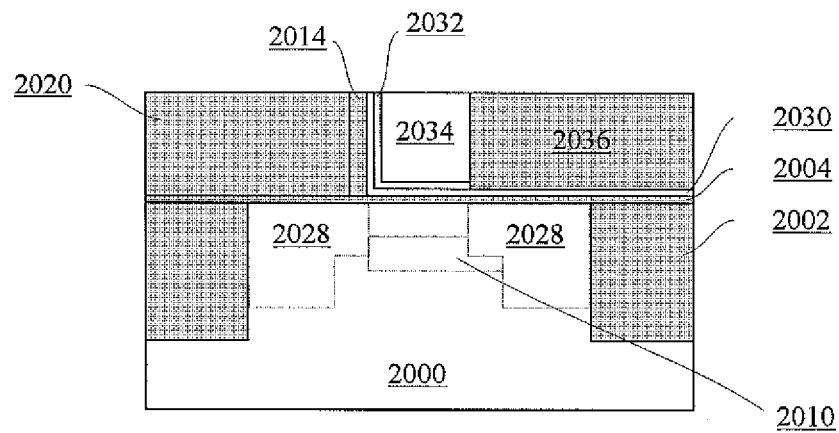

Next, as shown in FIG. 25, annealing, such as spike annealing, laser annealing, and flash annealing, can be performed to activate the implanted impurities, to form final source and drain regions 2028.

Subsequently, the second sub-spacer 2012 and the third sub-spacer 2022 can be removed by selective etching to leave the first sub-spacer 2014 remained. For example, the second sub-spacer 2012 (e.g., polysilicon or amorphous silicon) may be selectively removed by means of a TMAH solution, and the third sub-spacer 2022 (e.g., silicon nitride) may be selectively removed by hot phosphoric acid. As a result, a relatively large space (substantially corresponding to the gate region+ the other of the source and drain regions) is reserved on the side of the first sub-spacer 2014, so that it is easy to form a gate stack.

The flow can continue similarly to that shown in FIG. 16, and detailed descriptions thereof are omitted here. For example, the gate stack (including a gate dielectric layer 2030, a work function adjustment layer 2032, and a gate conductor 2034 in the form of spacer) and a dielectric layer 2036 can be formed. The resultant device is similar to that shown in FIG. 16, except that the SSWR 2010 extends to the opposite side.

Though the above descriptions in conjunction with the embodiment shown in FIGS. 22-26 do not involve an IL, operations for forming the IL can be done as described in the above embodiments.

In the above descriptions, details of patterning and etching of the layers are not described. It is to be understood by those skilled in the art that various measures may be utilized to form the layers and regions in desired shapes. Further, to achieve the same feature, those skilled in the art can devise processes not entirely the same as those described above. The mere fact that the various embodiments are described separately does not mean that means recited in the respective embodiments cannot be used in combination to advantage.

From the foregoing, it will be appreciated that specific embodiments of the disclosure have been described herein for purposes of illustration, but that various modifications may be made without deviating from the disclosure. In addition, many of the elements of one embodiment may be combined with other embodiments in addition to or in lieu of the elements of the other embodiments. Accordingly, the technology is not limited except as by the appended claims.

We claim:

1. A method for manufacturing a semiconductor device, comprising:
   forming a first shielding layer on a substrate, and forming a first spacer on a sidewall of the first shielding layer;
   forming one of source and drain regions with the first shielding layer and the first spacer as a mask;
   forming a second shielding layer on the substrate, and removing the first shielding layer;
   forming the other of the source and drain regions with the second shielding layer and the first spacer as a mask;
   removing at least a portion of the first spacer; and
   forming a gate dielectric layer, and forming a gate conductor in the form of spacer on a sidewall of the second shielding layer or on a sidewall of a remaining portion of the first spacer.

2. The method according to claim 1, wherein forming the first spacer comprises:
   forming a first sub-spacer on the sidewall of the first shielding layer; and
   forming a second sub-spacer on a sidewall of the first sub-spacer.

3. The method according to claim 2, wherein forming the other of the source and drain regions comprises:
   forming a second spacer on a sidewall of the first spacer; and
   forming the other of the source and drain regions with the second shielding layer, the first spacer and the second spacer as a mask.

4. The method according to claim 3, wherein removing at least a portion of the first spacer comprises:
   removing the second spacer and the first sub-spacer.

5. The method according to claim 3, wherein
   the first shielding layer comprises nitride,
   the second shielding layer comprises oxide,
   the first sub-spacer comprises polysilicon or amorphous silicon,
   the second sub-spacer comprises oxide, and
   the second spacer comprises nitride.

6. The method according to claim 1, further comprising:
   forming a super-steep-retrograded well in the substrate with the first shielding layer as a mask.

7. The method according to claim 1, wherein forming the source or drain region comprises:
   performing extension implantation; and
   performing source/drain implantation.

8. The method according to claim 7, wherein forming the source or drain region comprises:
   performing halo implantation.

9. The method according to claim 1, further comprising:
   forming an interfacial layer on the substrate.

10. A method for manufacturing a semiconductor device, comprising:
    forming a first shielding layer on a substrate;
    forming one of source and drain regions with the first shielding layer as a mask;
    forming a second shielding layer on the substrate, and removing at least a portion of the first shielding layer;
    forming a first spacer on a sidewall of the second shielding layer or on a sidewall of a remaining portion of the first shielding layer;
    forming the other of the source and drain regions with the second shielding layer, the possible remaining portion of the first shielding layer and the first spacer as a mask;
    removing the first spacer; and
    forming a gate dielectric layer, and forming a gate conductor in the form of spacer on a sidewall of the second shielding layer or on a sidewall of the remaining portion of the first shielding layer.

11. The method according to claim 10, wherein forming the first shielding layer comprises:
    forming a first shielding sub-layer; and
    forming a first sub-spacer on a sidewall of the first shielding sub-layer.

12. The method according to claim 11, wherein removing at least a portion of the first shielding layer comprises:
    removing the first shielding sub-layer.

13. The method according to claim 12, wherein forming the first spacer comprises:
    forming a second sub-spacer on a sidewall of the first sub-spacer; and
    forming a third sub-spacer on a sidewall of the second sub-spacer.

14. The method according to claim 13, wherein
    the first shielding layer comprises nitride,
    the second shielding layer comprises oxide,
    the first sub-spacer comprises oxide,
    the second sub-spacer comprises polysilicon or amorphous silicon, and
    the third sub-spacer comprises nitride.

15. The method according to claim 11, further comprising:
forming a super-steep-retrograded well in the substrate with the second shielding layer and the first sub-spacer as a mask.

16. A semiconductor device, comprising:
a substrate; and
source and drain regions and a gate stack formed on the substrate,
wherein the gate stack comprises:
  a gate dielectric layer; and
  a gate conductor, which is formed in the form of spacer on a sidewall of a dielectric layer or a gate spacer on one side of the gate stack, wherein the gate conductor has its side surface on the one side and also its bottom surface covered by the gate dielectric layer, and its side surface on the other side opposite to the one side covered by a further dielectric layer.

17. The semiconductor device according to claim 16, wherein the gate dielectric layer comprises a high-K dielectric material, and the gate conductor comprises a metal gate conductor material.

18. The semiconductor device according to claim 16, further comprising a work function adjustment layer disposed between the gate dielectric layer and the gate conductor.

19. The semiconductor device according to claim 18, wherein the work function adjustment layer comprises any one of TaC, TiN, TaTbN, TaErN, TaYbN, TaSiN, HfSiN, MoSiN, RuTa, NiTa, MoN, TiSiN, TiCN, TaAlC, TiAlN, TaN, PtSi, $Ni_3Si$, Pt, Ru, Ir, Mo, Hf Ru, $RuO_x$, or any combination thereof.

20. The semiconductor device according to claim 16, further comprising a super-steep-retrograded well formed in the substrate, which extends to either the source side or the drain side.

21. The semiconductor device according to claim 16, wherein an extent from the sidewall of the dielectric layer or the gate spacer on said one side to a sidewall of the further dielectric layer facing the gate stack is greater than or equal to a distance between the source region and the drain region.

* * * * *